United States Patent
Duenas et al.

[19]

[11] Patent Number: 6,075,691
[45] Date of Patent: Jun. 13, 2000

[54] THIN FILM CAPACITORS AND PROCESS FOR MAKING THEM

[75] Inventors: Salvador Duenas, Summit; Ratnaji Rao Kola, Berkeley Heights, both of N.J.; Henry Y. Kumagai, Orefield, Pa.; Maureen Yee Lau, Warren, N.J.; Paul A. Sullivan, Summit, N.J.; King Lien Tai, Berkeley Heights, N.J.

[73] Assignee: Lucent Technologies Inc., Murray Hill, N.J.

[21] Appl. No.: 08/918,174

[22] Filed: Aug. 25, 1997

Related U.S. Application Data

[63] Continuation-in-part of application No. 08/814,051, Mar. 9, 1997, Pat. No. 5,936,831.

[51] Int. Cl.[7] .............................. H01G 4/005; H01G 4/06
[52] U.S. Cl. .................................. 361/321.5; 361/321.1; 361/311; 361/303; 361/305
[58] Field of Search ............................ 361/321.5, 301.2, 361/301.4, 303, 305, 311, 321.1; 257/306, 309, 310

[56] References Cited

U.S. PATENT DOCUMENTS

| | | | |
|---|---|---|---|
| 4,364,099 | 12/1982 | Koyama et al. | 361/305 |
| 4,374,159 | 2/1983 | Pitetti et al. | 427/96 |
| 4,460,938 | 7/1984 | Clei | 361/411 |
| 4,491,509 | 1/1985 | Krause | 204/192 |
| 4,496,435 | 1/1985 | Karada | 204/15 |
| 5,177,670 | 1/1993 | Shinohara et al. | 361/388 |
| 5,382,347 | 1/1995 | Yahalom | 205/50 |
| 5,486,977 | 1/1996 | Hasegawa | 361/529 |
| 5,554,866 | 9/1996 | Nishioka et al. | 257/295 |
| 5,585,300 | 12/1996 | Summerfelt | 437/60 |
| 5,605,858 | 2/1997 | Nishioka et al. | 437/60 |
| 5,622,893 | 4/1997 | Summerfelt et al. | 438/396 |
| 5,656,852 | 8/1997 | Nishioka et al. | 257/632 |
| 5,670,408 | 9/1997 | Yamamichi et al. | 437/60 |
| 5,696,017 | 12/1997 | Ueno | 437/60 |
| 5,696,018 | 12/1997 | Summerfelt et al. | 437/60 |
| 5,729,054 | 3/1998 | Summerfelt et al. | 257/751 |
| 5,793,057 | 8/1998 | Summerfelt | 257/55 |
| 5,811,851 | 9/1998 | Nishioka et al. | 257/310 |

OTHER PUBLICATIONS

"Leakage Current Mechanism of Amorphous and Polycrystalline $Ta_2O_5$ Films grown by Chemical Vapor Deposition" by Aoyama, T. et al., *J. Electrochem. Soc.*, vol. 143, No. 3 pp. 977–983 (Mar. 1996).

"Microstructure and Electrical Properties of Tantalum Oxide Thin Film Prepared by Electron Cyclotron Resonance Plasma–Enhanced Chemical Vapor Deposition", by Kim I. et al., *Jpn. J. Applied Physics*, vol. 33, pp. 6691–6698 (Dec. 1994).

"Ultrathin Tantalum Oxide Capacitor Process Using Oxygen–Plasma Annealing," by Kamiyama, S. et al., *J. Electrochem. Soc.*, vol. 141, No. 5, pp. 1246–1251 (May 1994).

"Effects of Annealing Conditions on the Properties of Tantalum Oxide Films on Silicon Substrates," by Park, S. W. et al., *J. of Electrochem. Soc.*, vol. 21, No. 6, pp. 635–639 (1992).

"Formation of High–Quality, Magnetron–Sputtered $Ta_2O_5$ Films by Controlling the Transition Region at the $Ta_2O_5$/SiInterface", by Seki, S. et al., *J. Vac. Sci. Technol.*, 5(4), pp. 1771–1774 (Jul./Aug. 1987).

*Primary Examiner*—Kristine Kincaid
*Assistant Examiner*—Eric Thomas
*Attorney, Agent, or Firm*—Richard J. Botos

[57] ABSTRACT

A thin film capacitor for use in semiconductor integrated circuit devices such as analog circuits, rf circuits, and dynamic random access memories (DRAMs), and a method for its fabrication, is disclosed. The capacitor has a dielectric thickness less than about 50 nm, a capacitance density of at least about 15 $fF/\mu m^2$, and a breakdown field of at least about 1 MV/cm. The dielectric material is a metal oxide of either titanium, niobium, or tantalum. The metal oxide can also contain silicon or nitrogen. The dielectric material is formed over a first electrode by depositing the metal onto the substrate or onto a first electrode formed on the substrate. The metal is then anodically oxidized to form the dielectric material of the desired thickness. A top electrode is then formed over the dielectric layer. The top electrode is a metal that does not degrade the electrical characteristics (e.g. the leakage current or the breakdown voltage) of the dielectric layer.

8 Claims, 1 Drawing Sheet

THIN FILM CAPACITORS AND PROCESS FOR MAKING THEM

STATEMENT OF RELATED APPLICATION

This invention is a continuation-in-part of U.S. Ser. No. 08/814,051 which was filed on Mar. 9, 1997, now U.S. Pat. No. 5,936,831, which is incorporated by reference herein.

BACKGROUND OF THE INVENTION

1. Technical Field

This invention relates to thin film capacitors and methods for their manufacture and, in particular, to thin film capacitors in integrated circuits and multichip modules.

2. Art Background

Thin film capacitors are used in a variety of semiconductor integrated circuit devices such as analog circuits, rf circuits, and dynamic random access memories (DRAMs). As observed in U.S. Pat. No. 5,177,670 to Shinohara et al. the dielectric layer in such capacitors should be as thin as possible. Shinohara et al. observes that a good capacitor may not be obtained if the thickness of the dielectric layer is 100 nm or less. One reason for the lower limit on dielectric film thickness is that the breakdown field of capacitors with a thin layer of dielectric material (i.e. the voltage at which the leakage current becomes too high) is typically too low.

Aoyama, T., et al., "Leakage Current Mechanism of Amorphous and Polycrystalline $Ta_2O_5$ Films Grown by Chemical Vapor Deposition," *J. Electrochem. Soc.*, Vol. 143, No. 3, pp. 977–983 (March 1996) describes thin (i.e. the thickness of the $Ta_2O_5$ film was 85 nm) film capacitors having a breakdown voltage that was less than 2 volts when the gate was positive biased and about 3 volts when the capacitor was negative biased. In Aoyama et al. the capacitor is formed by depositing the $Ta_2O_5$ film and oxidizing it to reduce the leakage current through the film. However, to prevent the oxidation of the underlying silicon during the oxidation of the $Ta_2O_5$ film, a portion of the silicon electrode underlying the $Ta_2O_5$ is nitridized. The resulting dielectric layer is a dual layer of $Ta_2O_5$ and silicon nitride ($Si_3N_4$) which has an effective dielectric constant that is lower than a single layer of $Ta_2O_5$.

Aoyama et al. nitridized the underlying silicon to prevent the oxidation thereof when the $Ta_2O_5$ film was oxidized to reduce its leakage. As observed by Kim, I., et al., "Microstructure and Electrical Properties of Tantalum Oxide Thin Film Prepared by Electron Cyclotron Resonance Plasma-Enhanced Chemical Vapor Deposition," *Jpn. J. Appl. Phys.*, Vol. 33:1:12A, pp. 6691–6698 (1994), the effective dielectric constant of the $Ta_2O_5/SiO_2$ layer is lower than the dielectric constant of $Ta_2O_5$. The capacitance density of a capacitor is determined by the formula:

$$C/A = \epsilon_0 \epsilon_r / t$$

wherein C/A is the capacitance density, $\epsilon_0$ is a permittivity constant, $\epsilon_r$ is the relative dielectric constant of the capacitor's dielectric layer, and t is the thickness of the dielectric layer. Thus, for a given dielectric thickness, a capacitor having a dielectric material with a lower dielectric constant will have a lower capacitance density compared to a capacitor having a dielectric material with a higher dielectric constant. Also, given the inverse relationship between capacitance density and dielectric thickness, the thinner the dielectric material for a certain capacitor, the higher its capacitance density.

Accordingly, capacitors with a layer of high dielectric constant material that is less than 100 nm thick, yet having desirable leakage current and breakdown voltage, are desired.

SUMMARY OF THE INVENTION

The present invention is directed to a capacitor with a titanium oxide, tantalum oxide, or niobium oxide dielectric layer having a thickness of at least about 7 nm but less than about 50 nm that has current-voltage characteristics which are superior to known capacitors having a dielectric layer with similar thickness (i.e. the capacitors of the present invention have a capacitance density of at least about 15 $fF/\mu m^2$ and a breakdown field of at least about 1 megavolt (MV)/cm). The present invention is also directed to a process for making capacitors that have thin (i.e. thicknesses less than 50 nm) metal oxide dielectric layers. In certain embodiments, these metal oxides (e.g., titanium oxide, tantalum oxide, or niobium oxide) also contain nitrogen or silicon.

In the process, a metal-containing layer is either deposited on an insulating or semi-insulating substrate (i.e., a conventional substrate, e.g. an oxidized surface of a silicon substrate, glass, ceramic, kapton or other suitable substrates well known to one skilled in the art) or on a first electrode formed on such substrate, and oxidized anodically. In anodic oxidation a material (e.g. a metal) which acts as the anode is placed in a solution. A platinum electrode is used as the cathode. A voltage is applied between the metal anode and the platinum cathode. The metal anode in the solution is thereby oxidized. Materials and conditions for anodic oxidation are well known to one skilled in the art.

Because anodic oxidation occurs at low temperature (i.e. typically less than about 200° C.) the process of the present invention is compatible with low temperature processes for device fabrication. Consequently, in the embodiments of the present invention where the dielectric material is formed on a silicon-containing electrode (in certain DRAM devices the bottom electrode is a-doped silicon electrode), the underlying silicon is not substantially oxidized during the anodic oxidation of the overlying metal. When the dielectric material is formed on a metal electrode (in integrated circuit devices and multichip modules, the bottom electrode is typically a metal) such as aluminum (Al), the aluminum is unaffected by the anodic oxidation because it occurs at low temperature. In prior art processes, the aluminum electrode melted or otherwise deformed when subjected to the high temperature conditions at which the dielectric materials were annealed to improve their leakage characteristics.

In one embodiment of the present invention, a first electrode is formed on an insulating or semi-insulating substrate such as the oxidized surface of a silicon substrate. The first electrode is any conventional material that is suitably conductive such as a metal. In embodiments of the present invention wherein the capacitor is used in a DRAM device, the first electrode is either a doped silicon electrode or a metal electrode.

The dielectric layer is formed on the first electrode by first depositing a metal such as titanium (Ti), titanium nitride ($TiN_x$), titanium silicide ($TiS_x$), tantalum (Ta), tantalum nitride ($TaN_x$), tantalum silicide ($TaSi_x$), niobium (Nb), or niobium nitride ($NbN_x$) on the first electrode of the capacitor using conventional deposition techniques. The thickness of the metal layer is at least as thick or thicker than the desired dielectric layer thickness. The titanium-containing, tantalum-containing, or niobium-containing layer is then anodically oxidized to form a titanium dioxide ($TiO_2$) or titanium oxynitride layer, a niobium pentoxide ($Nb_2O_5$) or niobium oxynitride layer, a tantalum pentoxide ($Ta_2O_5$) layer, a tantalum silicon oxide or a nitrogen-doped tantalum pentoxide ($Ta_2O_5N_y$) layer. Other readily anodizable, high permittivity dielectric materials are also contemplated as suitable (e.g., hafnium). The thickness of the anodically oxidized portion is less than about 50 nm. It is advantageous if the thickness is at least about 7 nm. The unoxidized portion of the layer (if any) functions as part of the first electrode of the capacitor. Thus, the thickness of the metal layer is at least as thick or thicker than the resulting dielectric layer.

The second (counter) electrode of the capacitor is then formed on the dielectric layer. Any conventional metal is contemplated as suitable for the counter electrode (e.g. tungsten, titanium nitride, tantalum nitride, and chromium). In some processes, the device is subjected to a high temperature anneal after the counter electrode is formed on the dielectric layer. In these processes, metals (e.g. aluminum and copper) that will react with the adjacent dielectric layer under these thermal annealing conditions are not suitable as the second electrode. However, metals such as aluminum and copper are useful in devices formed using such processes provided that a barrier metal layer is first formed on the dielectric layer and that barrier metal does not react with the dielectric layer. The reactive metal layer is then formed on the barrier metal layer. Capacitors with two layers of metal formed on the dielectric layer are advantageous for certain applications. For example, a capacitor in which an aluminum layer is formed on a tungsten (W) layer has better high frequency performance than a capacitor which does not have the aluminum layer on the counter electrode.

The resulting capacitor has a capacitance density of at least about 15 fF/$\mu m^2$ and a breakdown field of at least about 1 MV/cm. It is advantageous if the breakdown field of the capacitor is at least about 3 MV/cm.

In one embodiment of the present invention, the capacitor of the present invention is formed by sputter deposition of aluminum onto an oxidized silicon substrate to form the first electrode. Tantalum nitride (TaN$_x$) having a thickness of about 100 nm to about 600 nm is then deposited onto the aluminum by a conventional technique (e.g., dc magnetron or rf sputtering). The TaN$_x$ is then anodically oxidized to form a dielectric region of Ta$_2$O$_5$Ny having a thickness of about 50 nm or less. The counter-electrode of the capacitor is then formed by depositing a layer of metal over the dielectric material.

The capacitors of the present invention have substantially the same characteristics when subjected to either a forward bias or a reverse bias. Also, because of the low leakage current density of the capacitors of the present invention (which is indicative of a low defect density), capacitors with larger areas than prior art capacitors are possible. Also, because of the fact that anodic oxidation of the metal occurs at relatively low temperatures, the process of the present invention is useful when forming capacitors on substrates that cannot be subjected to the high temperature annealing process prescribed by the prior art for reducing the leakage current density of dielectric materials.

DETAILED DESCRIPTION

Figure 1:
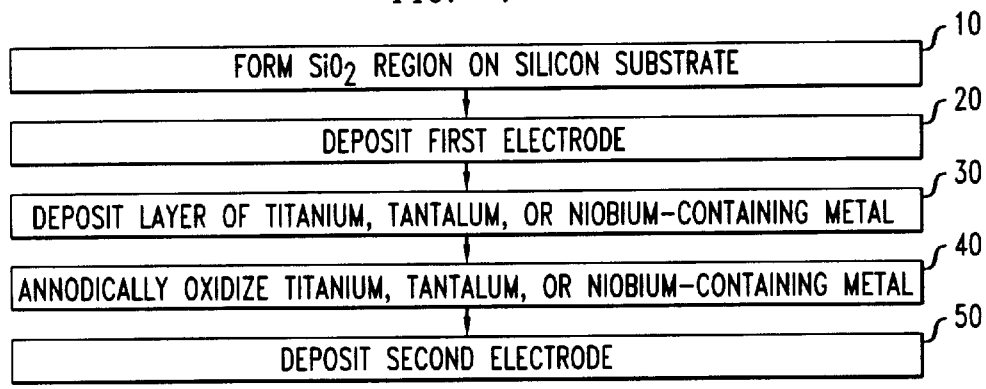
FIG. 1 is a flow diagram showing the steps of making a thin film capacitor of the present invention.
Figure 2:
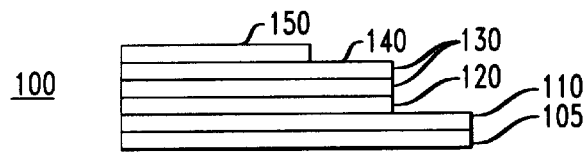
FIG. 2 is a schematic cross section of a first embodiment of a thin film capacitor made according to the method described in FIG. 1.

Referring to the drawings, FIG. 1 is a flow diagram for making an exemplary thin film capacitor of the present invention. This exemplary thin film capacitor is illustrated in FIG. 2. The first step 10 is to oxidize a portion of a silicon substrate 105 (FIG. 2) to form an insulating layer of SiO$_2$ 110 thereon. Silicon is oxidized using conventional expedients well known to one skilled in the art (e.g. heating the silicon substrate to a temperature of at least about 1000° C. in an oxygen-containing atmosphere). It is advantageous if the conditions are controlled to provide an SiO$_2$ layer with a thickness of about 0.1 $\mu$m to about 5 $\mu$m.

In an alternate embodiment, a layer of insulating material such as silicon nitride is formed on the silicon substrate. Methods for depositing silicon nitride layers onto silicon substrates are well known to those skilled in the art. For example, silicon nitride films are often deposited by the process of chemical vapor deposition (CVD).

In step 20, a layer of metal 120 is then formed over the SiO$_2$ layer. The metal layer 120 is the first electrode of the capacitor 100. Examples of suitable metals include Al, Ta, Ti, TaN$_x$, TiN$_x$, TiSi$_x$, Ta$_2$Si, and Nb. The thickness of the first electrode 120 is about 0.1 $\mu$m to about 1 $\mu$m. It is advantageous if the first electrode 120 is formed by sputter deposition. Conditions for sputter-deposition of metals are well known to one skilled in the art. Exemplary sputtering conditions for aluminum are 10 kW power and 20 sccm Argon. Exemplary thicknesses for the aluminum layer are about 0.1 $\mu$m to about 1 $\mu$m.

In certain embodiments of the present invention, the first electrode is anodized through only a portion of its thickness to form the dielectric layer. In these embodiments, the unanodized metal functions as either part of the first electrode (in which case the metal precursor of the dielectric layer is formed on the first electrode) or as the entire first electrode (in which case the metal precursor of the dielectric layer is formed directly on the substrate). In the embodiment described herein and in FIG. 1, the metal precursor of the dielectric layer is formed on the first electrode 120.

In step 30, a layer of a niobium-containing, titanium-containing, or tantalum-containing material 130 is then formed over the first electrode 120 of the capacitor 100. The layer is formed by sputter depositing Nb, NbN$_x$, Ti, TiN$_x$, TiSi$_x$, Ta, TaN$_x$, or Ta$_2$Si onto the first electrode of the capacitor. For example, a layer of TaN$_x$ is formed by magnetron reactive sputtering using a power of 4 kW and gas flows of 20 sccm Argon and about 2 to about 10 sccm of N$_2$. The nitrogen concentration in the TaN$_x$ film is in the range of about 8 to about 33 atomic percent and is obtained by varying the flow rates of Argon and N$_2$ during deposition. Similar conditions are used to deposit the other materials (nitrogen flow is omitted when nitrogen is not desired in the resulting dielectric film). The thickness of the deposited niobium-containing, titanium-containing or tantalum-containing material in the process of the present invention is sufficient to provide a dielectric layer of the desired thickness (which is less than about 50 nm). It is advantageous if the dielectric layer has a minimum thickness of about 7 nm. If the thickness of the deposited metal layers is thicker than the desired dielectric thickness, only a certain portion of the metal layer is subsequently oxidized to form a dielectric layer of the desired thickness. In the embodiment illustrated in FIG. 2, the unoxidized portion of the layer 130 forms a composite first capacitor electrode with the underlying metal layer 120.

In step 40, the niobium-containing, titanium-containing, or tantalum-containing layer 130 is then oxidized anodically to form a dielectric material 140. Anodization is a technique well known to those skilled in the art, and conventional materials and conditions for anodization are contemplated as suitable. For example, anodization of metal is performed in 0.01 weight percent citric acid solution using a platinum counter electrode. Exemplary anodization voltages for tanatalum-containing metal are in the range of 3–30 V, with a soak time of about one hour. The thickness of the anodically formed dielectric films are in the range of about 1.6 to about 2 nm per volt. Voltages and thickness for other dielectric materials are readily ascertained by those skilled in the art. As mentioned above, it is not required that the layer 130 be completely oxidized. However, layer 130 must be sufficiently oxidized to provide a dielectric layer of the desired thickness.

An attendant advantage to depositing a metal and converting it in-situ to a dielectric material using anodic oxidation is that the thickness of the dielectric material is uniform. The dielectric layers of the present invention have a thickness uniformity that is within the range of about one percent. If the dielectric material is deposited using a conventional deposition technique such as CVD, the resulting dielectric layer has thickness variations on the order of five percent.

In step 50, the second electrode 150 of the capacitor 100 is then formed on the anodized layer. The second electrode is a conventional material such as tungsten, titanium nitride, tantalum nitride, or chromium. The second electrode 150 is formed using conventional expedients such as sputter deposition. The sputter conditions used to form the first electrode of the capacitor are also useful for forming the second electrode of the capacitor.

Figure 3:
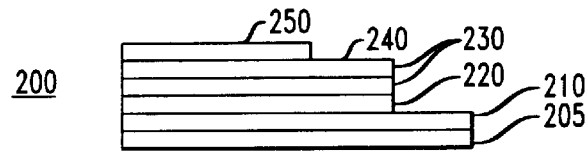
FIG. 3 is a schematic cross section of a capacitor of the present invention suited for use in DRAM devices.

In a second embodiment of the present invention, the capacitor is incorporated into a DRAM device. As previously noted, in DRAM devices, the first electrode is optionally doped silicon in addition to conventional metal electrodes. One example of such a device is illustrated in FIG. 3, wherein the capacitor 200 is formed on an oxidized surface 210 of a conventional silicon substrate 205. The doped silicon electrode 220 is formed on the oxidized surface 210. A metal layer 230 is formed on the doped silicon electrode 220. At least a portion of this metal layer 230 is anodically oxidized to form the dielectric layer 240. A second metal electrode 250 is then formed on the dielectric layer 240 to complete the capacitor 200. In this embodiment, the process of the present invention offers the additional advantage of not oxidizing the silicon electrode 220. As previously noted, if the silicon electrode is oxidized, the capacitance density of the resulting capacitor is reduced.

As previously noted, the capacitance density of the capacitor is equal to the product of its dielectric constant and a permittivity constant divided by its thickness. Since there is a practical lower limit to the thickness of the dielectric material below which the leakage characteristics of the materials become undesirably high, dielectric materials with a suitably high dielectric constant that provide a desirably high capacitance density, are sought.

For example, in order for the capacitors with a $Ta_2O_5N_x$ dielectric layer to have at least the specified capacitance, 15 $fF/\mu m^2$, the thickness of the dielectric layer must be, at most, about 12 nm. Table 1 below describes the thickness of the dielectric layer required to obtain capacitors with a desired capacitance density. As illustrated by Table 1, the capacitance density is a function of the thickness of the dielectric layer and its dielectric constant.

TABLE 1

| Capacitance Density | Thickness of the Dielectric Layer (nm) | | |
| --- | --- | --- | --- |
| $(fF/\mu m^2)$ | $Ta_2O_5$ | $TiO_2$ | $Nb_2O_5$ |
| 15 | 12 | 23.6–59 | 23.6–59 |
| 20 | 9 | 17.7–44.2 | 17.7–44.2 |

The range of dielectric layer thicknesses for capacitors with $TiO_2$ and $Nb_2O_5$ layers is based on the possible range of dielectric constants for these materials (about 40 to about 100). For example, if the dielectric constant of the $Nb_2O_5$ is about 40, the maximum thickness of the layer that will provide a capacitor with a capacitance density of 15 $fF/\mu m^2$ is 23.6 nm. If the dielectric constant of $Nb_2O_5$ is about 100, then the maximum thickness of the layer that will provide a capacitor with the desired capacitance density is about 59 nm. The dielectric constant of the $TiO_2$ and $Nb_2O_5$ vary depending upon the process conditions used to sputter deposit the metal, and the subsequent conditions used to anodically oxidize the metal. The dielectric constant of a particular material is readily ascertained by one skilled in the art.

Figure 4:
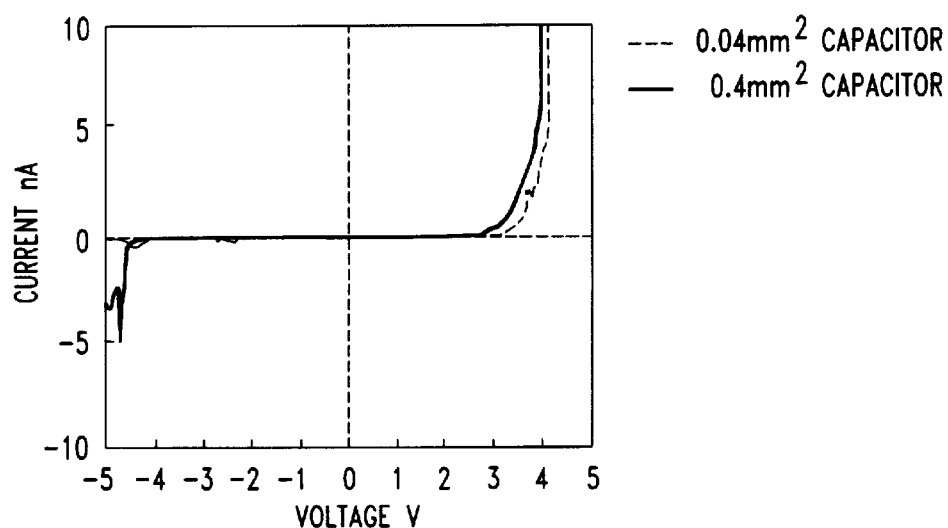
FIG. 4 illustrates the DC I–V characteristics of two capacitors having different areas, both with a Ta$_2$O$_5$N$_y$ dielectric layer having a thickness of 9 nm.

FIG. 4 illustrates the performance of two capacitors that had a 9 nm-thick layer of $Ta_2O_5N_x$ formed thereon. Each capacitor was formed on an insulating region of $SiO_2$ formed on a silicon substrate. The $SiO_2$ insulating layer had a thickness of 1 $\mu m$. The first electrode of the capacitor was a layer of aluminum that had a thickness of 0.25 $\mu m$ with a 0.4 $\mu m$-thick layer of $TaN_x$ formed thereon. This layer was anodized to produce the 9 nm-thick layer of $Ta_2O_5N_x$. The second electrode of the capacitor was a tungsten layer that had a thickness of about 100 nm. An aluminum layer with a thickness of about 1 $\mu m$ was formed over the tungsten electrode. One capacitor had an area of 0.04 $mm^2$ and a second capacitor had an area of 0.4 $mm^2$.

The capacitance density and breakdown field of the capacitors were measured by measuring the current flowing through the capacitors at various voltages. FIG. 4 illustrates the current flowing through the capacitors at various voltages in the range of −5 volts to 5 volts. The capacitors were therefore both forward biased (positive voltages were applied) and reverse biased (negative voltages were applied). For the capacitor with an area of about 0.04 $mm^2$, the current flowing through the capacitor was less than $10^{-7}$ $A/cm^2$ when voltages in the range of about −4 volts to about 3 volts were applied to the capacitor. For the capacitor with an area of about 0.4 $mm^2$, the current flowing through the capacitor was less than $10^{-7}$ $A/cm^2$ when voltages in the range of about −4 volts to about 2.9 volts were applied to the capacitor. When voltages less than (i.e. more negative) −4 volts were applied to the device, leakage current flowed through the device. When voltages greater than about 3 volts (greater than 2.9 volts in the case of the larger area capacitor) were applied to the capacitor, leakage current was observed to flow through the capacitor.

Thus FIG. 4 illustrates that the capacitors of the present invention had a very high threshold voltage before the dielectric material passed leakage current. Furthermore, FIG. 4 illustrates that the capacitors have the same breakdown field, 4.4 Mv/cm, independent of the area of the capacitors. This indicates that the defect density of the dielectric materials of the present invention is sufficiently low to permit the fabrication of large area capacitors.

What is claimed is:

1. A capacitor comprising a first electrode, a layer of dielectric material with a thickness of about 50 nm or less formed over the first electrode by depositing a layer of metal selected from the group consisting of titanium, titanium nitride, niobium, niobium nitride, tantalum, tantalum silicide and tantalum nitride on the first electrode and anodically oxidizing the metal and a second electrode formed over the dielectric layer, wherein the capacitor has a capacitance density of at least about 15 fF/$\mu$m$^2$ and a breakdown field of at least about 1 MV/cm and wherein the capacitor is formed on a substrate.

2. The capacitor of claim 1 wherein the dielectric material is selected from the group consisting of titanium dioxide, nitrogen-containing titanium dioxide, titanium silicon oxide, niobium pentoxide, nitrogen-containing niobium pentoxide, tantalum pentoxide, nitrogen-containing tantalum pentoxide, and tantalum silicon oxide.

3. The capacitor of claim 1 wherein the first electrode comprises doped silicon and there is essentially no oxidized silicon interposed between the first electrode and the layer of dielectric material.

4. The capacitor of claim 1 wherein the first electrode is a metal electrode and wherein there is an insulating layer of silicon dioxide formed between the first electrode and the substrate.

5. The capacitor of claim 2 wherein the dielectric material is tantalum pentoxide or nitrogen-doped tantalum pentoxide and the thickness of the dielectric material is about 7 nm to about 12 nm.

6. The capacitor of claim 1 wherein the breakdown field is at least about 3 MV/cm.

7. The capacitor of claim 1 wherein the second electrode comprises at least a first layer of metal wherein the metal is selected from the group consisting of tungsten and chromium.

8. The capacitor of claim 7 wherein the second electrode further comprises a second layer of metal formed over the first layer and wherein the second metal layer is selected from the group consisting of aluminum and copper.

* * * * *